United States Patent

Gaskin et al.

[11] Patent Number: 4,501,131
[45] Date of Patent: Feb. 26, 1985

[54] CRYOGENIC COOLER FOR PHOTOCONDUCTIVE CELLS

[75] Inventors: Virginia R. Gaskin, Orlando; Eugene P. Horvath, Longwood; Richard M. Jansson, Maitland, all of Fla.

[73] Assignee: The United States of America as represented by the Secretary of the Army, Washington, D.C.

[21] Appl. No.: 567,727

[22] Filed: Jan. 3, 1984

[51] Int. Cl.³ .............................................. F25B 19/00
[52] U.S. Cl. .................................. 62/514 R; 62/383; 165/185; 250/352
[58] Field of Search ............. 62/514 R, 383; 250/352; 165/185

[56] References Cited

U.S. PATENT DOCUMENTS

| | | | |
|---|---|---|---|
| 3,807,188 | 4/1974 | Lagodmos | 62/514 R |
| 3,851,173 | 11/1974 | Taylor et al. | 62/514 R |
| 4,190,106 | 2/1980 | Dunmire et al. | 62/514 R |
| 4,194,119 | 3/1980 | Mackenzie | 62/514 R |
| 4,324,104 | 4/1982 | Horn et al. | 62/514 R |
| 4,344,302 | 8/1982 | Jarrett, Jr. et al. | 62/514 R |
| 4,412,427 | 11/1983 | Horn et al. | 62/514 R |

*Primary Examiner*—Ronald C. Capossela
*Attorney, Agent, or Firm*—Anthony T. Lane; Robert P. Gibson; Norman L. Wilson, Jr.

[57] ABSTRACT

Resolution and sensitivity of photoconducting light sensitive devices vary inversely with temperature. Hence it is desirable to provide cooling means for photoconductive radiation detectors. One type of low temperature photoconductor is fabricated by placing the photomultiplier tube in a double-walled vacuum Dewar flask. In another type, the detector is mounted near a cryogenic projection, or cold finger, emenating from a refrigerator. In this case fabrication is critical, and great care must be exercised when the cryogenic cold finger is inserted in the Dewar well in order to avoid breakage. A different solution herein to the problem provides detector not as subject as prior devices to breakage of the Dewar detector wall.

4 Claims, 1 Drawing Figure

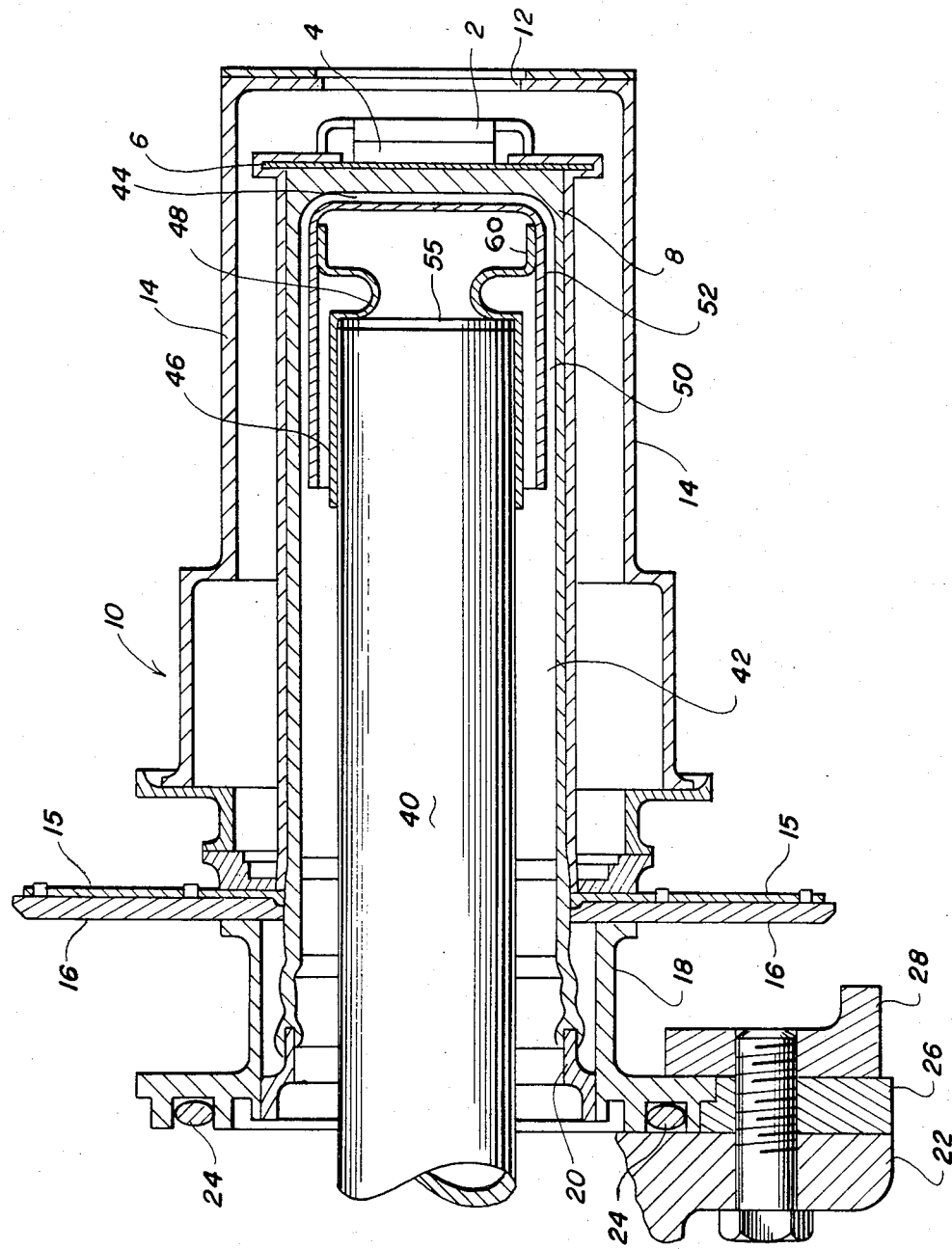

CRYOGENIC COOLER FOR PHOTOCONDUCTIVE CELLS

BACKGROUND OF THE INVENTION

This invention in one of its aspects relates to radiation detectors of the type utilizing photoconductive cells. In another of its aspects the invention pertains to detectors having their photomultiplier tubes mounted within cryogenic coolers.

Photoconductive cells are devices used for detecting or measuring electromagnetic radiation due to variations in the conductivity of certain materials, called photoconductors, by virtue of absorption of radiation by these materials. Such photoconductive cells are used in electronic equipment for many purposes, especially for the detection of electromagnetic radiation having wavelengths greater than those detectable by the human eye, such as infrared radiation. It is known, that resolution and sensitivity of photoconducting light sensitive devices vary inversely with temperature. Hence deleterious effects are obtained if they are operated at elevated temperatures. These effects are mitigated if the radiation sensitive elements in these devices are held at extremely low temperatures. To this end it is desirable to provide cooling means for photoconductive radiation detectors. Photoconductors are generally cooled with liquid nitrogen at −196° C., with liquid hydrogen at −250° C., or with liquid helium at −269° C. to increase their sensitivities. But this is not easy where the detectors are subject to vibrations, such as aircraft instruments.

One type of low temperature photoconductor is fabricated by placing the photomultiplier tube in double-walled vacuum Dewar flask which is then filled with a refrigerant such as dry ice or liquid nitrogen. This device is not completely satisfactory because it restricts the use of the multiplier phototube to one position. To overcome this restriction the detector array has been mounted near a projection or cold finger emanating from a refrigerator, the refrigerator being either an open cycle or closed cycle cooling system. The cooling function of the refrigerator is directed toward the end of a cold finger that extends from the cooler.

More specifically, in a cold finger cooled infared detector, a cold finger extends into a well formed by an inner Dewar wall and contacts the substantially flat portion of the Dewar wall at the bottom of the well adjacent the detector. A disadvantage of this cold finger system is that length of the cold finger is not always the same as the depth of the Dewar well. Therefore, it has been necessary to extend the cold finger by some means to bring it against the inner Dewar wall for efficient cooling.

One previously used means for extending the cold finger involves a spring housing fitting the end of the cold finger with a coupling member physically contacting the inner Dewar wall. A spring within the coupling member urges it against the wall as shown in U.S. Pat. No. 3,851,173. A flexible heat transfer strip within the coupling increases heat transfer between the coupling member and the cold finger to cool the Dewar wall.

The spring-type detector, while providing for conductive cooling, is nevertheless subject to certain disadvantages. As pointed out in U.S. Pat. No. 3,807,188 when a cold finger of a refrigerator is mechanically coupled to a device to be cooled and the device is mounted in or on a glass Dewar, misalignment can cause the Dewar to break. To overcome this problem in U.S. Pat. No. 3,807,188 a conductive neck is used surrounded by a bellows. The neck, in good conductance with the Dewar base plate, is fabricated in a metal such as copper, and it extends into the well toward the cold finger. The bellows, shaped to surround this conductive neck, is directly secured to the cold finger so that misalignment between the conductive neck and the cold finger is compensated for by the flexure of the bellows. Mercury fills the bellows. Once frozen, there is a solid metal-to-metal conductive path from the end of the cold finger, through the conductive neck, to the surface to be cooled.

The two types of Dewar detectors having cold fingers and including flexible construction such as the bellows described in U.S. Pat. No. 3,807,188, and the spring means described in U.S. Pat. No. 3,851,173, do not adequately solve the cryogenic cooling problem because they are in physical contact with the Dewar wall. Mechanical vibrations frequently occur in coolers, and these vibrations can be so severe that even if they do not break the Dewar, the presence of the vibrations can be detected with relatively unsophisticated sound detection equipment, even at fairly large distances. The problem can be greatly overcome by the use of balanced designs and more efficient cooling cycles, but a small component of vibration remains which is transmitted to the Dewar/detector. Aside from the stress problems presented, this residual vibration, termed detector microphonism, affects the quality of the image produced by the radiation detector.

To overcome the vibration problem a recent solution is the development of a cold finger thermal coupling which involves the use of a rigid coupling member contoured to substantially match but not quite touch the inner contour of the well formed by the inner Dewar wall. However, fabrication is critical, partly due to the non-forgiving design and configuration of the assembly. Moreover great care must be exercised when the cryogenic cold finger is inserted in the Dewar well in order to avoid its breakage. This invention relates to still a different solution to the problem, providing a thermal coupler not as subject as prior devices to breakage of the Dewar detector well.

SUMMARY OF THE INVENTION

For effective cooling of an electromagnetic radiation detector, wherein the detector is placed in a cryogenic cooler in the form of a Dewar vacuum chamber mating with a refrigerator cold finger which cools the Dewar chamber the cold finger must be close to, but not touch the cryogenic end of the detector. To provide for this spacing herein a radially crimped temperature conducting tubular member is slideably mounted on, and thermally engages the end of the cold finger, with the annular radial crimp configured, when necessary, to retain a shim between the cold finger tip and the crimp for proper spacing. The tubular member is sufficiently thin-gauged so that its thinness in combination with the crimp permits the tubular member to flex, avoiding damage to the Dewar chamber should physical contact occur during assembly. The portion of the tubular member above the annular crimp is enlarged so that its sides extend outwardly in close proximity to the Dewar chamber walls. A temperature conducting, heat transfer, cap is disposed over the enlarged tubular member upper portion, providing a maximum area for radiant conductance. The heat transfer cap is spaced from the Dewar wall so that it does not touch it when vibrated by an aircraft or otherwise, but it is close enough to radiantly cool the detector.

DETAILED DESCRIPTION OF THE INVENTION

This invention can perhaps best be understood by the consideration of a specific embodiment thereof in conjunction with the drawings.

The FIGURE is an elevation in cross section of a detector of the invention.

As indicated, for optimum performance electromagnetic radiation detectors are cooled with a cryogenic material. In one refrigerating module the detector is coupled with a double walled Dewar flask which is filled with the cryogen as shown in the FIGURE. Detector 2 is an infrared sensitive diode such as gallium arsenide, gallium phosphide, lead-tin-telluride or mercury-cadimum-telluride, bonded to a mount 4 which is cemented to a ceramic disc 6. The disc 6 is secured to the glass inner wall 8 inside a Dewar flask 10. The detector faces a window 12 in the outer Dewar wall 14. The window is transparant to electromagnetic radiation frequencies to which detector 2 is sensitive, for example infrared radiation. Conductive leads 15 run from the detector to support washer 16 and then to the electro-optical equipment. The washer is fused to the inner wall of the Dewar to form a vacuum-tight seal. The Dewar thus consists of the two walls 8 and 14 evacuated in the usual manner.

To connect the Dewar to a refrigerating unit a metal base structure is provided. This base includes toroidal elements 18 and 20. A flange 22 of the cooling device abuts this base structure and engages an O-ring 24 carried thereby to seal off the atmosphere in the well. Clamping members 26 and 28 are provided with machine screws which hold the Dewar and cooler structures together.

The refrigeration unit includes a cold finger 40 extending into a well 42. Cold finger 40 is the refrigerated portion of the cryogenic cooler, the Dewar walls 8 and 14 impeding temperature losses. The cold finger, as noted in the background of the invention can be cooled to temperatures as low as −269° C. in known refrigeration, systems utilizing cryogenic materials such as helium, and preferably, argon. Other cooling agents such as carbon dioxide, the various hydrocarbons or halogen-substituted hydrocarbons, and ketones such as acetone can also be used.

In order to maximize cooling efficiency it is necessary to have the tip of the cold finger 40 as close as possible to the detector. Originally it was believed that for maximum cooling of the detector physical conductance was necessary. This meant that the cold finger had to contact the Dewar well bottom. To this end, because of differing cold finger lengths and well depths conductive thermal couplings were inserted between the tip of the cold finger and the well bottom. Various types of prior art couplings have been previously described herein.

It has recently been found that radiant conductance rather than physical conductance can be used to cool the detector, thereby overcoming the problem of detector microphonism referred to previously herein. As a result of this discovery a gap of predetermined width is provided between the thermal coupling and the well bottom. This gap, 44 herein, is greater than the differential of expansion of the glass well and the cold finger, including its thermal coupling. The gap is usually about one ten thousandth of an inch. It is created by shims 55 whose differing thicknesses determine the gap width.

In spite of air gap 44 it is difficult to maximize cooling with a thermal coupling which will not break the Dewar flask upon insertion into the well or which will not vibrate to distort the output. To allow the detector herein to flex, should it be pressed against a Dewar wall, a flexible tubular member 46 fits tightly over a tip of cold finger 40, thermal, silicone, grease being used therebetween if desried. Tubular member or sleeve 46 is provided with a circumferential identure or radial crimp 48 which allows it to compress or flex when necessary. The tubular member also has an enlarged upper portion 60. This enlarged portion 60 is sized so that when cap 52 perfectly fits over it as shown the appropriately sized gap 50 results. A uniform gap 44 and 50 thus surrounds cap 52 to provide maximum radiant conductive cooling. An advantage of the thermal coupling of this invention is the achievable degree of cooling. The outer surface of cap 52 provides an unusually large area for readiant conductance compared to the neck (26) of U.S. Pat. No. 3,807,188, or the coupling member (112) of U.S. Pat. No. 3,851,173. This member is so far from the Dewar walls that it must be supplemented with a conductive heat strip 118.

Having been given the teachings of this invention variations or ramifications will occur to those skilled in the art. Thus cap 52 can slideably engage enlarged end 60 of tubular member 46, or it can be brazed or otherwise secured thereto. In addition this thermal coupler, i.e. the inner indentured tubular member 46 and the outer heat transfer cap 52, can be fabricated of various conductive materials and still maintain the desired flexibility and required heat transfer properties. A desirable thermal coupler can be made by electrodeposition or electroforming of copper sandwiched between two layers of nickel. In addition to these materials, the components comprising the thermal coupler can be constructed thru electordeposition using other conductive materials such as copper or gold. Such modifications are deemed to be within the scope of this invention.

What is claimed is:

1. In the apparatus for maintaining an electromagnetic radiation detector at extremely low temperatures wherein the detector is placed in a cryogenic cooler in the form of a Dewar vacuum chamber mating with a refrigerator cold finger including a tip which cools the Dewar chamber, a thermal coupling heat transfer mechanism comprising;

(1) a circumferentially crimped temperature conducting tubular member slideably mounted on, and thermally engaging the end of, the cold finger, with its annular or radial crimp adapted to retain a shim between the tip of the cold finger and the crimp,
  (a) the tubular member being sufficiently thin-gauged so that its thinness in combination with the crimp permits the tubular member to flex, avoiding damage to the Dewar chamber should physical contact occur during assembly,
  (b) the diameter of the tubular member upper portion above the radial crimp being enlarged so that the tube sides are in close proximity to the Dewar chamber walls; and (2) a heat transfer cap integral with the enlarged tubular member upper portion adapted to be radiantly cooled thereby, and to be spaced from the Dewar wall a distance slightly exceeding the differential of expansion of the thermal coupling,
(a) the sides of said cap extending downwardly over the tubular member and cold finger top and along the Dewar chamber wall providing an increased Dewar wall cooling surface.

2. The apparatus of claim 1 wherein a removable shim member is disposed between the cold finger and the radial crimp, so that the thermal coupling height can be adjusted for different well depths of different Dewars.

3. The apparatus of claim 1 wherein the tubular member conducting cap is an electroformed nickel conductor.

4. The apparatus of claim 1 wherein the tubular member conducting cap is an electroformed copper conductor.

* * * * *